US009306061B2

(12) United States Patent
Cheng et al.

(10) Patent No.: US 9,306,061 B2
(45) Date of Patent: Apr. 5, 2016

(54) FIELD EFFECT TRANSISTOR DEVICES WITH PROTECTIVE REGIONS

(71) Applicant: Cree, Inc., Durham, NC (US)

(72) Inventors: Lin Cheng, Chapel Hill, NC (US);
Anant Agarwal, Chapel Hill, NC (US);
Vipindas Pala, Morrisville, NC (US);
John Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 156 days.

(21) Appl. No.: 13/799,049

(22) Filed: Mar. 13, 2013

(65) Prior Publication Data

US 2014/0264563 A1 Sep. 18, 2014

(51) Int. Cl.

| H01L 29/76 | (2006.01) |
|---|---|
| H01L 29/94 | (2006.01) |
| H01L 29/78 | (2006.01) |
| H01L 29/66 | (2006.01) |
| H01L 29/739 | (2006.01) |
| H01L 29/16 | (2006.01) |

(52) U.S. Cl.
CPC ...... *H01L 29/7827* (2013.01); *H01L 29/66068* (2013.01); *H01L 29/66666* (2013.01); *H01L 29/7397* (2013.01); *H01L 29/1608* (2013.01)

(58) Field of Classification Search
CPC ................ H01L 29/7827; H01L 29/66666
USPC ........................................ 257/330; 438/270
See application file for complete search history.

(56) References Cited

U.S. PATENT DOCUMENTS

| 5,821,600 | A | 10/1998 | Chan |
| 5,976,936 | A | 11/1999 | Miyajima et al. |
| 6,710,403 | B2 | 3/2004 | Sapp |
| 6,974,750 | B2 | 12/2005 | Haase |
| 7,183,229 | B2 | 2/2007 | Yamanaka |
| 7,843,004 | B2 | 11/2010 | Darwish |
| 2004/0099905 | A1 | 5/2004 | Baliga |
| 2004/0166637 | A1 | 8/2004 | Ito et al. |

(Continued)

FOREIGN PATENT DOCUMENTS

| JP | 9-74191 | 3/1997 |
| JP | 2010-258386 | 11/2010 |
| JP | 2012-164707 | 8/2012 |

OTHER PUBLICATIONS

International Search Report and the Written Opinion of the International Searching Authority corresponding to International Application No. PCT/US2014/021781; Mailing Date: Jun. 26, 2014; 10 pages.

(Continued)

*Primary Examiner* — Theresa T Doan
(74) *Attorney, Agent, or Firm* — Myers Bigel & Sibley, P.A.

(57) ABSTRACT

A transistor device includes a first conductivity type drift layer, a second conductivity type first region in the drift layer, a body layer having the second conductivity type on the drift layer including the first region, a source layer on the body layer, and a body contact region that extends through the source layer and the body layer and into the first region. The transistor device further includes a trench through the source layer and the body layer and extending into the drift layer adjacent the first region. The trench has an inner sidewall facing away from the first region. A gate insulator is on the inner sidewall of the trench, and a gate contact is on the gate insulator.

14 Claims, 10 Drawing Sheets

(56) References Cited

U.S. PATENT DOCUMENTS

| | | |
|---|---|---|
| 2004/0241950 A1 | 12/2004 | Olofsson |
| 2005/0082542 A1 | 4/2005 | Sumakeris et al. |
| 2007/0029573 A1 | 2/2007 | Cheng et al. |
| 2008/0105949 A1 | 5/2008 | Zhang et al. |
| 2008/0164520 A1 | 7/2008 | Darwish |
| 2008/0268587 A1 | 10/2008 | Sadaka et al. |
| 2009/0189228 A1 | 7/2009 | Zhang et al. |
| 2009/0206924 A1* | 8/2009 | Zeng et al. ............ 327/581 |
| 2010/0059814 A1 | 3/2010 | Loechelt et al. |
| 2010/0207198 A1 | 8/2010 | Blanchard et al. |
| 2011/0156054 A1 | 6/2011 | Takeuchi et al. |
| 2011/0241111 A1 | 10/2011 | Tamaki et al. |
| 2011/0254010 A1 | 10/2011 | Zhang |
| 2011/0298044 A1 | 12/2011 | Yagi et al. |
| 2012/0007142 A1 | 1/2012 | Nagaoka et al. |
| 2012/0187421 A1 | 7/2012 | Cheng et al. |
| 2012/0193643 A1 | 8/2012 | Masuda et al. |
| 2012/0235164 A1 | 9/2012 | Zhang et al. |
| 2012/0248462 A1 | 10/2012 | Wada et al. |
| 2012/0305943 A1 | 12/2012 | Honaga et al. |
| 2012/0313112 A1 | 12/2012 | Wada et al. |
| 2014/0015036 A1 | 1/2014 | Fursin et al. |

OTHER PUBLICATIONS

International Search Report and the Written Opinion of the International Searching Authority corresponding to International Application No. PCT/US2014/021737; Mailing Date: Jun. 20, 2014; 11 pages.

International Search Report and the Written Opinion of the International Searching Authority corresponding to International Application No. PCT/US2014/021759; Mailing Date: Jul. 7, 2014; 13 pages.

PCT internationai Preliminary Report on Patentability and Written Opinion mailed Sep. 24, 2015 corresponding to PCT International Application No. PCT/US2014/021759 (11 pages).

\* cited by examiner

FIELD EFFECT TRANSISTOR DEVICES WITH PROTECTIVE REGIONS

CROSS REFERENCE TO RELATED APPLICATION

The present application is related to U.S. application Ser. No. 13/798,919, entitled "FIELD EFFECT TRANSISTOR DEVICES WITH REGROWN LAYERS," U.S. application Ser. No. 13/799,142, entitled "FIELD EFFECT TRANSISTOR DEVICES WITH BURIED WELL PROTECTION REGIONS," and U.S. application Ser. No. 13/799,316, entitled "FIELD EFFECT TRANSISTOR DEVICES WITH BURIED WELL REGIONS AND EPITAXIAL LAYERS," all of which are filed concurrently herewith. The disclosures of each of the foregoing applications are incorporated herein by reference in their entirety.

FIELD OF THE INVENTION

The present invention relates to electronic devices and fabrication methods. More particularly, the present invention relates to high power insulated gate field effect and bipolar transistors and related fabrication methods.

BACKGROUND

Power semiconductor devices are widely used to regulate large current, high voltage, and/or high frequency signals. Modern power electronic devices are generally fabricated from monocrystalline silicon semiconductor material. One widely used power device is the power Metal Oxide Semiconductor (MOS) Field Effect Transistor (MOSFET). In a power MOSFET, a control signal is supplied to a gate electrode that is separated from the semiconductor surface by an intervening silicon dioxide insulator. Current conduction occurs via transport of majority carriers, without the presence of minority carrier injection that is used in bipolar transistor operation.

MOSFETS can be formed on a silicon carbide (SiC) layer. Silicon carbide (SiC) has a combination of electrical and physical properties that make it attractive as a semiconductor material for high temperature, high voltage, high frequency and/or high power electronic circuits. These properties include a 3.2 eV energy bandgap, an electric breakdown of about 2.4 MV/cm, a 4.9 W/cm-K thermal conductivity, and a $2.0 \times 10^7$ cm/s electron drift velocity.

Consequently, these properties may allow silicon carbide-based power electronic devices to operate at higher junction temperatures, higher power density levels, higher frequencies (e.g., radio, S band, X band), and/or with lower specific on-resistance and/or higher blocking voltages than silicon-based power electronic devices. A power MOSFET fabricated in silicon carbide is described in U.S. Pat. No. 5,506,421 to Palmour entitled "Power MOSFET in Silicon Carbide" and assigned to the assignee of the present invention.

Although silicon carbide itself is theoretically capable of sustaining high reverse voltages, it may be desirable to shield certain portions or features of a silicon carbide device, such as the gate insulator, the device edge, etc., from high electric fields, as breakdown may be more likely to occur at these locations.

SUMMARY

A method of forming a transistor device includes providing a drift layer having a first conductivity type, forming a first region in the drift layer, the first region having a second conductivity type that is opposite the first conductivity type, forming a body layer having the second conductivity type on the drift layer including the first region, forming a source layer on the body layer, the source layer having the first conductivity type, and forming a body contact region having the second conductivity type, the body contact region extending through the source layer and the body layer and into the first region. The method further includes forming a trench in the source layer and the body layer, the trench extending into the drift layer adjacent the first region and having an inner sidewall facing away from the first region, forming a gate insulator on the inner sidewall of the trench, and forming a gate contact on the gate insulator.

Forming the first region may include selectively implanting dopants into the drift layer.

Selectively implanting dopant atoms into the drift layer may include selectively implanting dopants at an implant energy of less than about 10 keV or in some embodiments less than 1 MeV.

A distance between the first region and a bottom corner of the trench may be about 0.1 microns to about 3 microns, while a vertical distance between bottom of the first region and a bottom corner of the trench may be about 0.1 microns to about 2 microns.

The body layer and the source layer may be formed by epitaxial regrowth.

The body layer may be formed by epitaxial regrowth and the source layer may be formed by ion implantation.

The method may further include doping an upper portion of the drift layer adjacent the trench with first conductivity type dopants more heavily than a lower portion of the drift layer to form a current spreading region in the upper portion of the drift layer.

The first region may be shallower than the current spreading region.

The methods may forming an epitaxial channel layer on a sidewall of the trench, the epitaxial channel layer having the second conductivity type. Forming the epitaxial channel layer may include forming a semiconductor layer having the second conductivity type on the source layer and on the sidewall and floor of the trench, and anisotropically etching the semiconductor layer to remove the semiconductor layer from the source layer and from the floor of the trench to thereby form a channel layer on the sidewall of the trench adjacent the source layer and the body layer.

A method of forming a transistor device according to further embodiments includes providing a drift layer having a first conductivity type, forming a body layer on the drift layer, the body layer having a second conductivity type that is opposite the first conductivity type, forming a source layer on the body layer, the source layer having the first conductivity type, selectively implanting second conductivity type dopants through the source layer and the body layer and into the drift layer to form a first region in the drift layer, and forming a body contact region having the second conductivity type, the body contact region extending through the source layer and the body layer and into the first region. The method further includes forming a trench in the source layer and the body layer, the trench extending into the drift layer adjacent the first region, the trench having an inner sidewall facing away from the first region, forming a gate insulator on the inner sidewall of the trench, and forming a gate electrode contact on the gate insulator.

Selectively implanting second conductivity type dopants into the drift layer may include implanting boron ions into the drift layer, and the method may further include thermally annealing the implanted boron ions to diffuse the boron ions to within about 0.1 to 3 microns of a bottom corner of the trench.

The method may further include doping an upper portion of the drift layer adjacent the trench with first conductivity type dopants more heavily than a lower portion of the drift layer to form a current spreading region in the upper portion of the drift layer.

The first region may be shallower than the current spreading region.

A transistor device according to some embodiments includes a drift layer having a first conductivity type, a first region in the drift layer, the first region having a second conductivity type that is opposite the first conductivity type, a body layer having the second conductivity type on the drift layer including the first region, a source layer on the body layer, the source layer having the first conductivity type, and a body contact region having the second conductivity type, the body contact region extending through the source layer and the body layer and into the first region. The transistor device further includes a trench in the source layer and the body layer, the trench extending into the drift layer adjacent the first region, the trench having an inner sidewall facing away from the first region, a gate insulator on the inner sidewall of the trench, and a gate electrode contact on the gate insulator.

A distance between the first region and a bottom corner of the trench may be about 0.1 microns to about 3 microns, while a vertical distance between bottom of the first region and a bottom corner of the trench may be about 0.1 microns to about 3 microns.

The body layer and the source layer may include epitaxial layers.

An upper portion of the drift layer adjacent the trench may be doped with first conductivity type dopants more heavily than a lower portion of the drift layer to provide a current spreading region in the upper portion of the drift layer.

The first region may be shallower than the current spreading region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Some embodiments of the invention provide silicon carbide (SiC) insulated gate devices that are suitable for high power and/or high temperature applications.

Embodiments of the present invention provide trench UMOS structures that include highly doped well regions in the drift layer that protect the bottom corners of the UMOS trench from high electric fields in reverse blocking conditions. Some embodiments further include current spreading layers at an upper surface of the drift layer that may reduce spreading resistance that may be increased due to the presence of the highly doped well regions.

In conventional n-channel vertical-trench MOSFET structures, when the device is operated in a reverse blocking condition, the lower corners of the well may be subjected to high electric fields due to electric field crowding at the corners of the trench. These high electric fields may result in early breakdown of the device at the gate insulator at the lower corners and/or bottom of the trench, which degrades device performance and may affect long term reliability of the devices.

In contrast, some embodiments of the present invention provide structures that protect the lower corners of the trench against high electric fields while maintaining low on-resistance.

Figure 1:
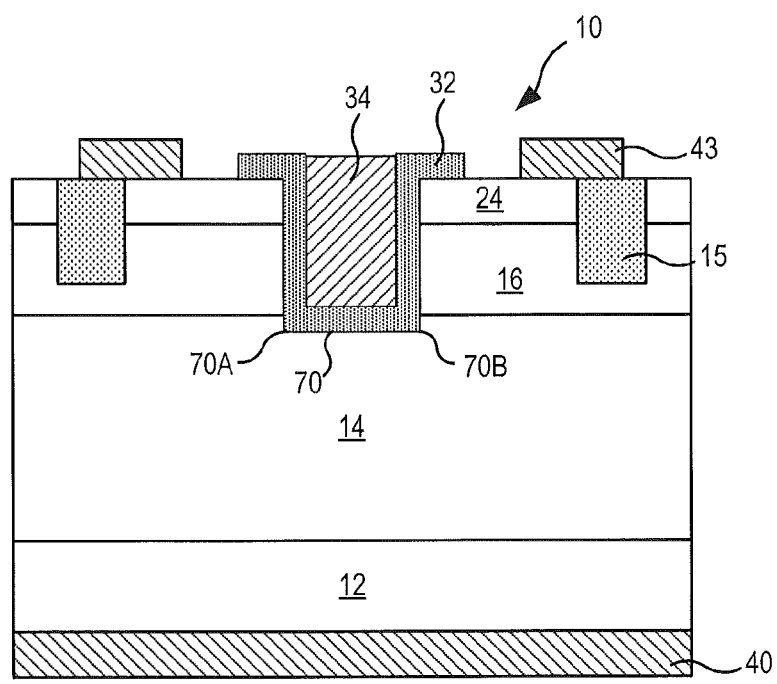
FIG. 1 is a cross sectional illustration of a cell of a conventional power MOSFET device.

A unit cell 10 of a conventional MOSFET structure is shown in FIG. 1. The device 10 includes an n-type epitaxial drift layer 14 on an n+4H—SiC substrate 12.

The structure further includes a p-type body region 16 on the drift layer 14 and an n+ source region 24 on the p-body region 16. The structure 10 further includes p+ body contact regions 15 that extend through the n+ source region 24 and into the p-type body region 16.

A trench 70 extends through the n+ source region 24 and the p-body region 16 and into the n-type drift layer 14. A gate insulator 32 is formed on sidewall surfaces and bottom surfaces of the trench 70. A doped polysilicon gate electrode 34 is on the gate insulator 32.

Source ohmic contacts 43 are formed on the body contact regions 15 as well as on the source region 24. A drain contact 40 is on the substrate 12 opposite the drift layer 14.

As noted above, in a conventional MOSFET structure, when the device is reversed biased, electric field crowding may lead to high electric fields at the lower corners 70A, 70B and bottom of the trench 70.

A typical device mesa where both n+ and p+ metal contacts are made to the source region 24 and the body contact regions 15 is in the range of sub-micron to several microns wide. Conventionally, the body contact regions 15 may be formed to extend into the drift layer 14, and may provide some protection to the lower corners of the trench 70. However, due to the thickness of the source region 24 and the p-body region 16, it is difficult to control the distance between the body contact regions 15 and the bottom corners of the trench 70 so that the distance is small enough to provide electrical shielding but not so small as to undesirably increase the on-resistance of the device. Moreover, because high energy ion implantation is required to form the body contact regions 15 deep enough to protect the corners and bottom of the trench 70, lateral implantation straggle may cause the body contact regions 15 to extend close enough to the trench 70 to affect the MOS threshold voltage and inversion channel mobility.

Figure 2:
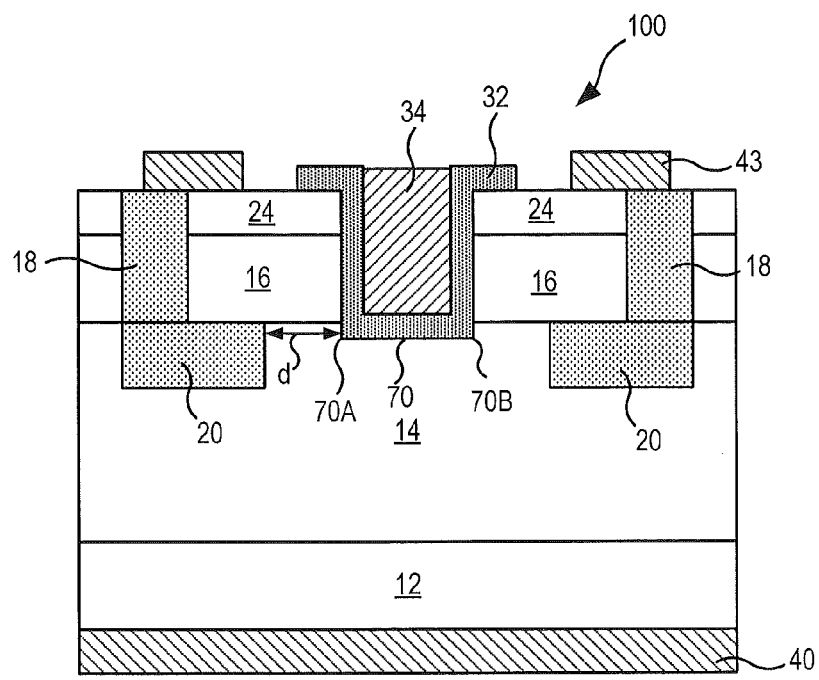
FIG. 2 is a cross sectional illustration of a cell of a power MOSFET device according to some embodiments.

A unit cell 100 of a MOSFET structure according to some embodiments is shown in FIG. 2.

Referring to FIG. 2, the device 100 includes an epitaxial drift layer 14 having a first conductivity type on a substrate 12. The substrate 12 may be a 2° to 8° off-axis 4H—SiC substrate, although other substrates or substrate materials may be used. The epitaxial layers may also include silicon carbide and/or other materials. The drift layer 14 may have a thickness of about 5 μm to about 200 μm, and may be doped with n-type dopants at a doping concentration of about $5 \times 10^{13}$ cm$^{-3}$ to about $2 \times 10^{16}$ cm$^{-3}$. Other doping concentrations/voltage blocking ranges are also possible.

The device 100 further includes a second conductivity type body region 16 and a first conductivity type source region 24 that may be formed by selective implantation of opposite conductivity type dopants, respectively, into the drift layer 14. Alternatively, one or both of the body region 16 and the source region 24 may be formed by epitaxial growth on the drift layer 14. The source region 24 has the same conductivity type as the drift layer (i.e., the first conductivity type), while the body region 16 has the second conductivity type.

The body region 16 may have a doping concentration from about $1 \times 10^{15}$ cm$^{-3}$ to about $5 \times 10^{18}$ cm$^{-3}$ and may have a thickness of about 0.1 μm to 10 μm. In particular embodiments, the body region 16 may have a doping concentration of about $2 \times 10^{18}$ cm$^{-3}$ and may have a thickness of about 0.5 μm to 2 μm A trench 70 extends through the source region 24 and the body region 16 and into the drift layer 14.

The device 100 further includes body contact regions 18 that extend through the source region 24 and the body region 16. The body contact regions 18 have the second conductivity type.

Highly doped buried well regions 20 having the second conductivity type are formed at an upper surface of the drift layer 14. The buried well regions 20 contact the body contact regions 18 and extend towards respective lower corners 70A, 70B of the trench 70. A distance d from the buried well region 20 to a corresponding lower corner 70A, 70B of the trench may be about 0.1 μm to about 3 μm. In some embodiments, the distance d may be about 0.5 μm to 2 μm, and in some embodiments, the distance d may be about 0.8 μm to 1 μm.

In some embodiments, the buried well regions 20 may be formed by selective ion implantation into the drift layer 14 before formation of the body region 16 by epitaxial regrowth. Accordingly, the buried well regions 20 may be formed using low energy implantation, which may reduce implant straggle and may provide more precise control over the locations of the buried well regions 20 and, more particularly, more precise control over the distance d between the buried well regions 20 and the lower corners 70A, 70B of the trench 70.

In other embodiments, the body contact regions 18 and the buried well regions 20 may be formed by implanting a first species of dopant ion through the source layer 24 and the body layer 16 to form the body contact regions 18 and implanting a second species of dopant ion into the source layer 24 and the body layer 16 and into the drift layer 14 to form the buried well regions 20, where the second species of dopant has a greater diffusivity in the semiconductor material than the first species of dopant. The structure is then annealed to cause the second species of dopant to diffuse closer to the trench corners than the first species of dopant. In some embodiments, the semiconductor material may include silicon carbide, the first species of dopant may include aluminum, and the second species of dopant may include boron, which has a higher diffusivity in silicon carbide than aluminum.

The buried well regions 20 may have a doping concentration from about $1 \times 10^{18}$ cm$^{-3}$ to about $1 \times 10^{21}$ cm$^{-3}$ and may extend a depth of about 0.1 μm to 5 μm into the drift layer 14.

The heavily doped source layer 24 can be epitaxially grown or formed by selective ion implantation into the body layer 16. The source layer 24 may have a thickness of 0.1 μm to 1 μm and may have a doping concentration in the range of $1 \times 10^{18}$ cm$^{-3}$ to $1 \times 10^{21}$ cm$^{-3}$.

Source ohmic contacts 43 are formed on exposed portions of the first body contact regions 18 as well as the source region 24. The source ohmic contacts 43 may include, for example, Ni, Al, Ti, Si, etc.

A gate insulator 32 is formed on sidewall surfaces and bottom surfaces of the trench 70. The gate insulator 32 may, for example, be silicon oxide, or silicon nitric oxide or a stack of both.

A gate electrode 34 is on the gate insulator 32. The gate electrode 34 may, for example, include doped polysilicon. The gate electrode 34 may also extend up over the channel layer 34 and onto the source region 24.

FIGS. 3A to 3E are cross sectional views illustrating the fabrication of a power MOSFET device according to some embodiments.

Figure 3A:
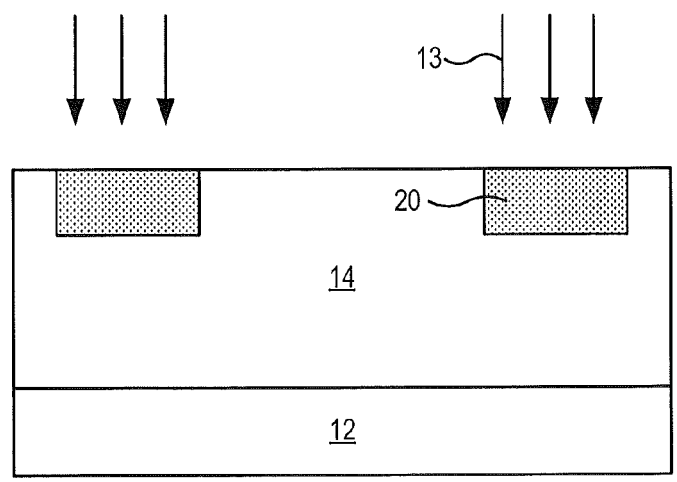
FIGS. 3A to 3E are cross sectional views illustrating the fabrication of a power MOSFET device according to some embodiments.

Referring to FIG. 3A, a substrate 12 is provided. The substrate 12 may be an off-axis SiC substrate having the 2H, 4H, 6H, 3C or 15R polytype. In particular embodiments, the substrate 12 may be an n+2° to 8° off-axis 4H SiC substrate.

A drift layer 14 is formed on the substrate 12. The drift layer 14 may have a thickness of about 5 μm to 200 μm, and may be doped with n-type dopants, such as nitrogen or phosphorus, at a doping concentration of about $5 \times 10^{13}$ cm$^{-3}$ to about $2 \times 10^{16}$ cm$^{-3}$. Other doping concentrations/voltage blocking ranges are also possible. In particular embodiments, the substrate may include a 4° off-axis 4H—SiC substrate and the drift layer may have a thickness of about 12 μm and may be doped with dopants at a doping concentration of about $6 \times 10^{15}$ cm$^{-3}$.

Next, buried well regions 20 may be formed in the drift layer 14 by selective implantation of p-type dopant ions 13, such as aluminum ions, into the drift layer 14. The p-type dopant ions may be implanted to have a uniform or non-uniform doping profile, such as a graded doping profile. The p-type dopant ions may be implanted such that the buried well regions may have a doping concentration of about $1 \times 10^{18}$ cm$^{-3}$ to about $1 \times 10^{21}$ cm$^{-3}$ and may extend a depth of about 0.1 μm to 1 μm into the drift layer 14.

Figure 3B:
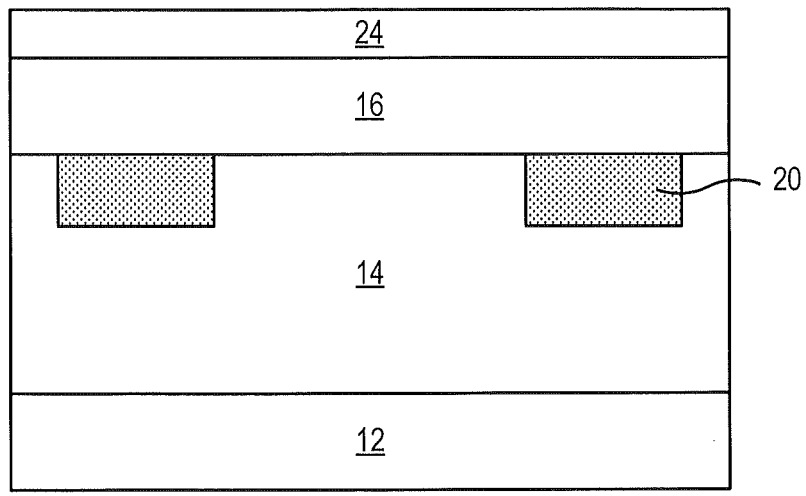

Referring to FIG. 3B, a body region 16 is formed on the drift layer 14. The body region 16 may be doped with p-type dopants at a doping concentration of about 1 to $2 \times 10^{18}$ cm$^{-3}$, and may have a thickness of about 0.5 μm to about 2 μm. The body region 16 may be formed by ion implantation and/or epitaxial growth on the drift layer 14.

A source region 24 is formed on the body region 16. The source region 24 may be doped with n-type dopants at a doping concentration of about $1 \times 10^{18}$ cm$^{-3}$ to about $1 \times 10^{21}$ cm$^{-3}$, and may have a thickness of about 0.1 μm to about 1 μm. The source region 24 may be formed by ion implantation and/or epitaxial growth. The doping profile in the source region 24 may be uniform in some embodiments. In other embodiments, the doping profile in the source region 24 may have a gradient and/or a delta doping profile.

Figure 3C:
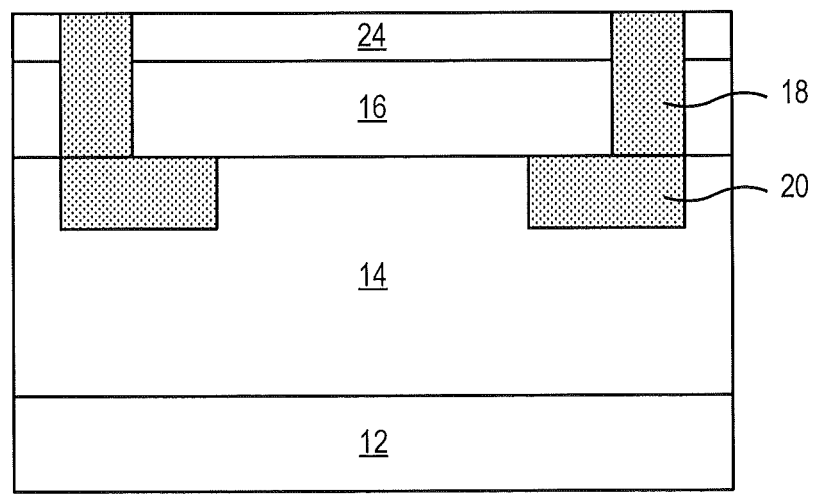

Referring to FIG. 3C, body contact regions 18 are formed by ion implantation into the structure on a side of the epitaxial region opposite the substrate 12. The body contact regions 18 may be formed to extend through the source region 24 and the body region 16 and into the buried well regions 20. The body contact regions 18 may be formed using a multiple implant profile, resulting in a doping concentration of about $1 \times 10^{18}$ cm$^{-3}$ to about $1 \times 10^{21}$ cm$^{-3}$. The body contact region 18 may have a width of about 1 to 3 μm.

The implanted dopants may be activated by annealing the structure at a temperature of about 1500° C. to 1800° C. with a silicon over pressure and/or covered by an encapsulation layer such as a graphite film. A high temperature anneal may damage the surface of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure from silicon out-diffusion during the anneal. The graphite coating may be applied by a conventional resist coating method and may have a thickness of about 0.5 μm to 10 μm. The graphite coating may be heated to form a crystalline coating on the drift layer 14. The implanted ions may be activated by a thermal anneal that may be performed, for example, in an inert gas at a temperature of about 1500° C. or greater. In particular the thermal anneal may be performed at a temperature of about 1650° C. in argon for 30 minutes. The graphite coating may help to protect the surface of the drift layer 14 from silicon out-diffusion during the high temperature anneal.

The graphite coating may then be removed, for example, by ashing and/or thermal oxidation.

Figure 3D:
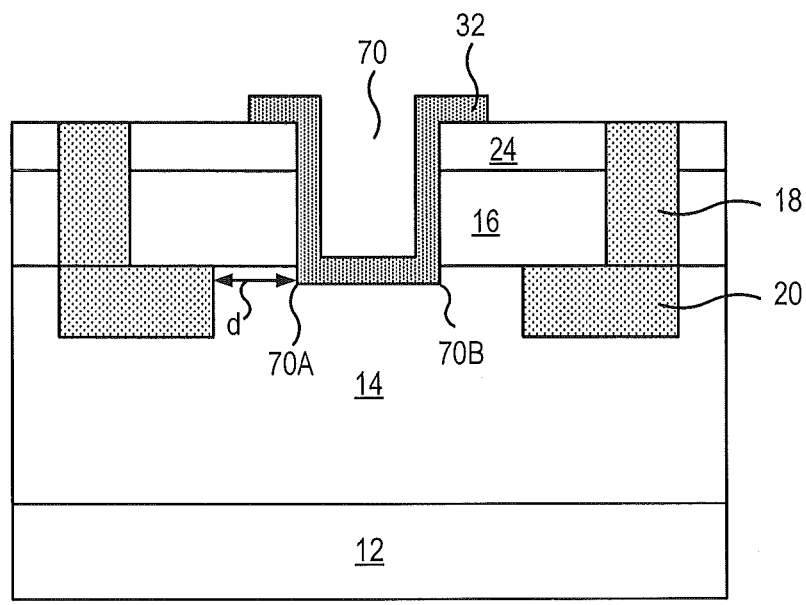

Referring to FIG. 3D, a trench 70 is formed in the structure between the body contact regions 18. The trench may be sized so that lower corners 70A, 70B of the trench are spaced about 0.1 μm to 2 μm from the edges of the respective buried well regions 20 in a lateral direction. The trench 70 extends through the source layer 24 and the body layer 16 to the drift layer 14. A gate insulator 32 is formed in the trench 70 by a gate oxidation process, with a final gate oxide thickness of 200-2000 Å.

In particular, the gate insulator 32 may be formed using an annealed high temperature or a PECVD deposition process.

In some embodiments, an oxide layer may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1300° C. in dry $O_2$ for a time of about 0.5 to 2 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

Figure 3E:
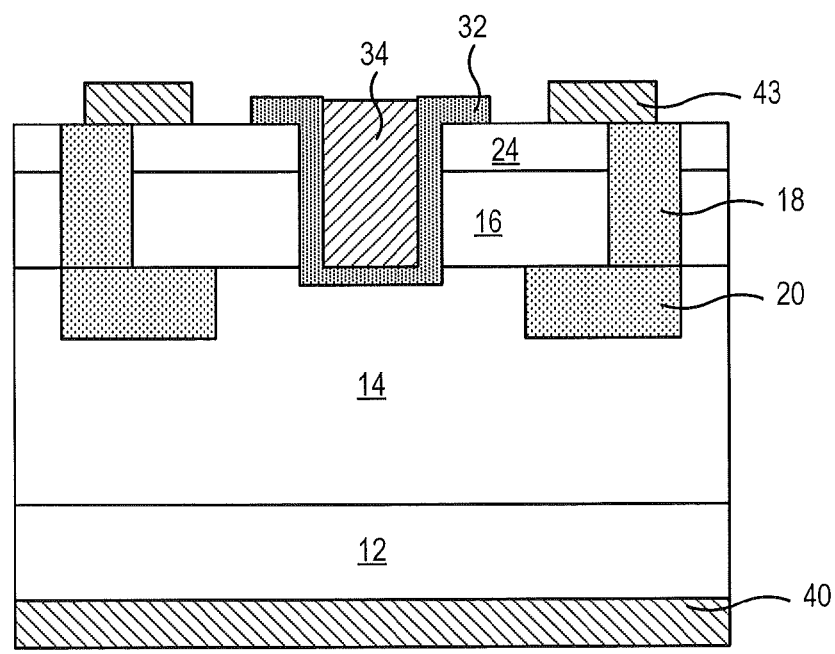

Referring to FIG. 3E, after formation of the gate insulator 32, a polysilicon gate 34 may be deposited in the trench 70 and doped, for example, with boron and/or phosphorus.

Ni may be deposited as the n-type source ohmic contact 43 and the drain ohmic contact 40. The contacts may be sintered by rapid thermal annealing (RTA).

Figure 4:
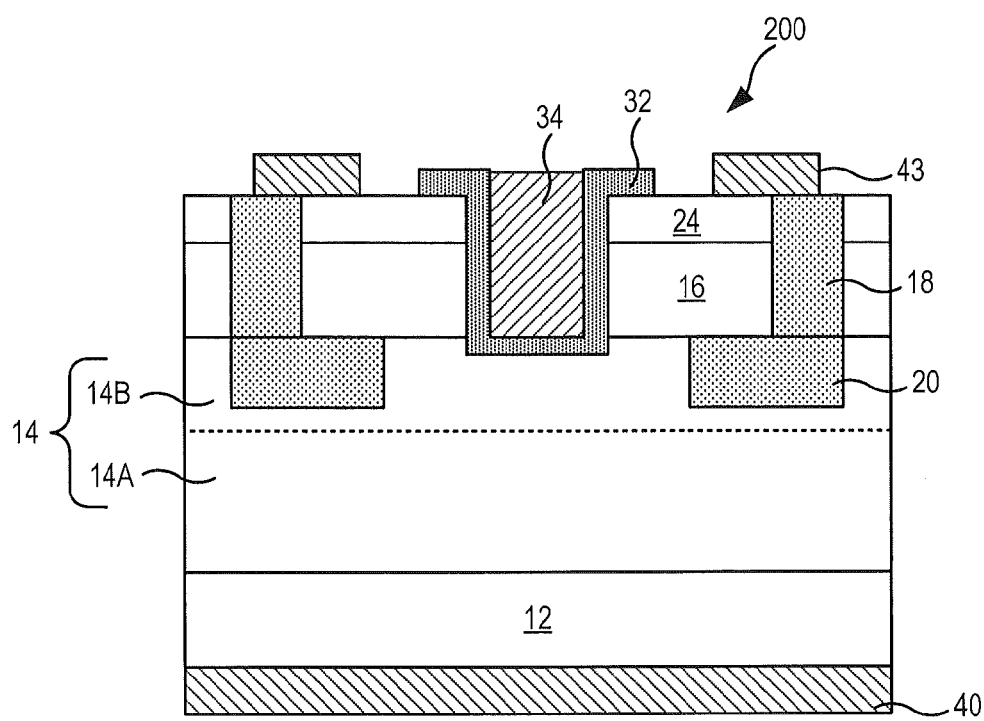
FIG. 4 is a cross sectional illustration of a cell of a power MOSFET device according to further embodiments.

FIG. 4 is a cross sectional illustration of a unit cell 200 of a MOSFET structure according to some further embodiments. The structure of the device 200 is similar to the structure of the device 100, except that the drift layer 14 of the device 200 includes a first sub-layer 14A at the lower part of the drift layer 14 adjacent the substrate 12 and a second sub-layer 14B at the upper part of the drift layer 14 opposite the substrate 12.

The second sub-layer 14B has a higher doping concentration than the first sub-layer 14A. In particular, the first sub-layer 14A may have a doping concentration of about $5 \times 10^{13}$ to $2 \times 10^{16}$ cm$^{-3}$, while the second sub-layer 14B may have a doping concentration of about $5 \times 10^{15}$ to $1 \times 10^{17}$ cm$^{-3}$.

The second sub-layer 14B may have a thickness that is greater than the depth of the buried well regions 20. That is, the buried well regions 20 may extend into the second sub-layer 14B but may not extend all the way to the first sub-layer 14A. In some embodiments, the second sub-layer 14B may have a thickness of about 0.5 to 3 μm.

The second sub-layer 14B may reduce the spreading resistance of the device that may otherwise be increased due to presence of the buried well regions 20.

FIGS. 5A to 5F are cross sectional views illustrating the fabrication of a power MOSFET device according to further embodiments.

Figure 5A:
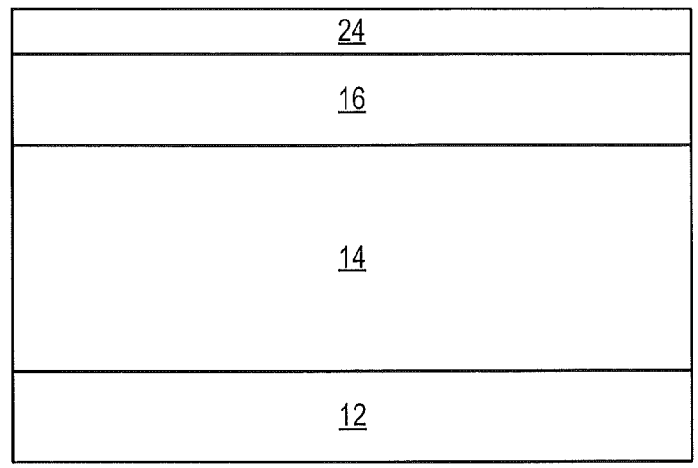
FIGS. 5A to 5F are cross sectional views illustrating the fabrication of a power MOSFET device according to further embodiments.

Referring to FIG. 5A, a drift layer 14, a body layer 16 and a source layer 24 are formed by epitaxial growth on a substrate 12. The drift layer 14, body layer 16, a source layer 24 and substrate 12 may be similar to the corresponding layers/regions in the device structure 100 illustrated in FIG. 2.

Figure 5B:
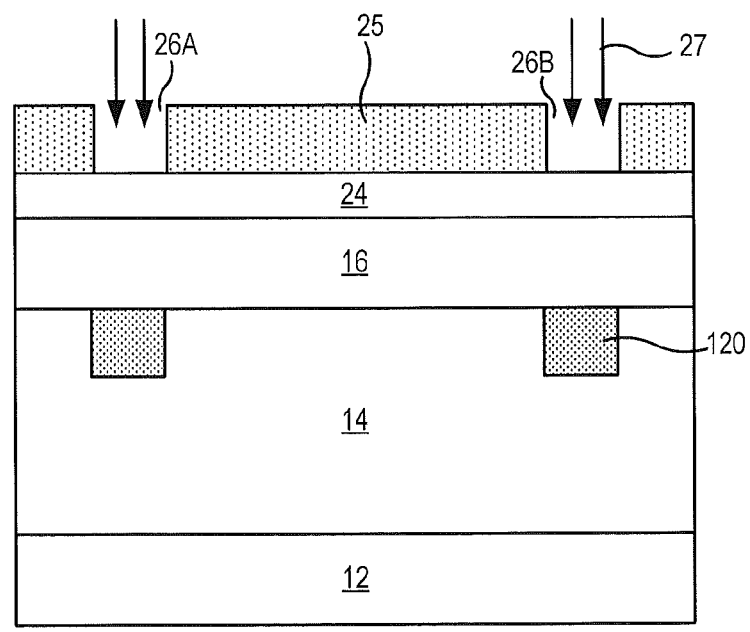

Referring to FIG. 5B An implant mask 25 including openings 26A, 26B is formed on the source layer 24, and first dopant ions 27 are implanted through the openings 26A, 26B and into the epitaxial structure. The implant energy and dose are selected to form buried well regions 120 at the surface of the drift layer 14. In particular, the first dopant ions may include boron and may be implanted at a dose of greater than $5 \times 10^{13}$ cm$^{-2}$ and an implantation energy greater than about 300 keV.

Figure 5C:
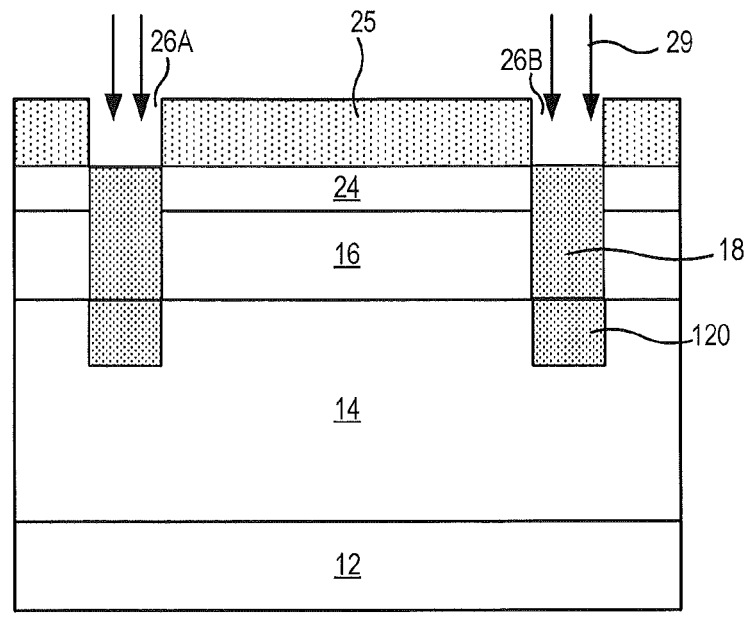

Referring to FIG. 5C, second dopant ions 29 may then be implanted through the openings 26A, 26B into the body layer 16 and the source layer 24 to form the body contact regions 18. The implant energy and dose are selected to form body contact regions 18 that extend from an upper surface of the source layer 24 to the buried well regions 120. Moreover, the second dopant ions 29 may have a lower diffusivity in the semiconductor material than the first dopant ions 27. In particular, the second dopant ions 29 may include aluminum and may be implanted at a dose of $1 \times 10^{15}$ cm$^{-2}$ and an implant energy greater than 200 keV.

Figure 5D:
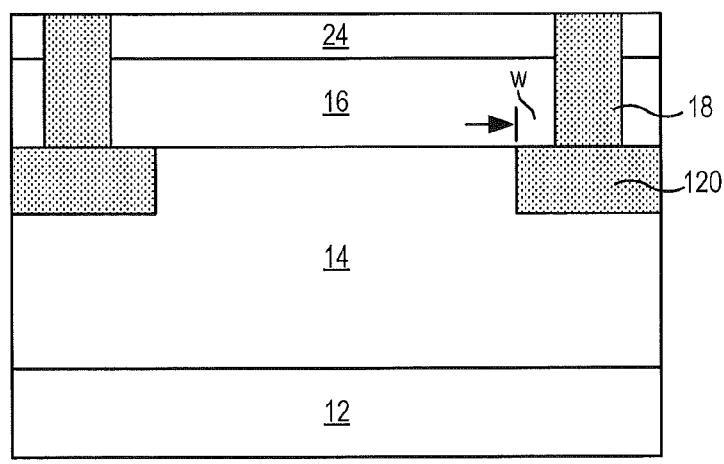

Referring to FIG. 5D, the implanted ions may be annealed as described above to activate the implants. The activation anneal may be performed at a sufficient temperature and for a sufficient time to cause the second dopant ions in the buried well region 120 to diffuse outward. Because of the difference in diffusivity between the first and second dopant ions, the buried well regions 120 may extend laterally away from the body contact regions 18 by a width w that may be at least about 2 μM, although the width w could be more or less than 2 μm.

Figure 5E:
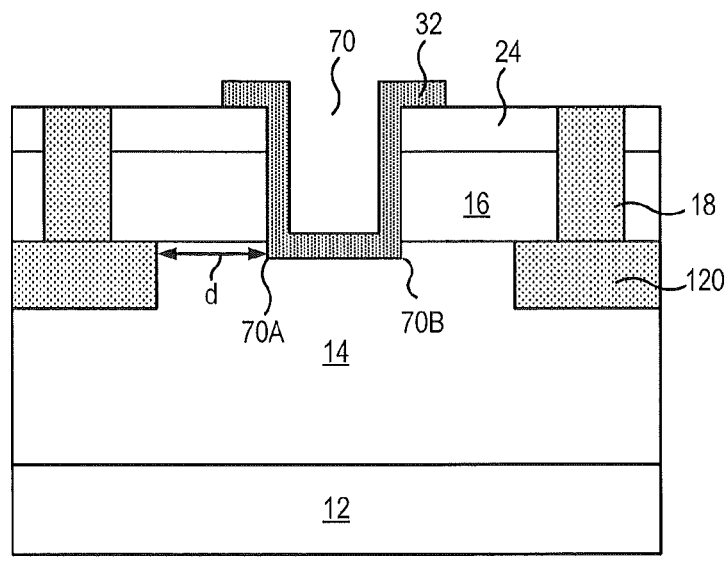

Referring to FIG. 5E, trench 70 is formed in the structure between the body contact regions 18. The trench may be sized so that lower corners 70A, 70B of the trench are spaced about 0.1 μm to 1 μm from the edges of the respective buried well regions 120. The trench 70 extends through the source layer 24 and the body layer 16 to the drift layer 14. A gate insulator 32 is formed in the trench 70 by a gate oxidation process, with a final gate oxide thickness of 200-2000 Å.

Figure 5F:
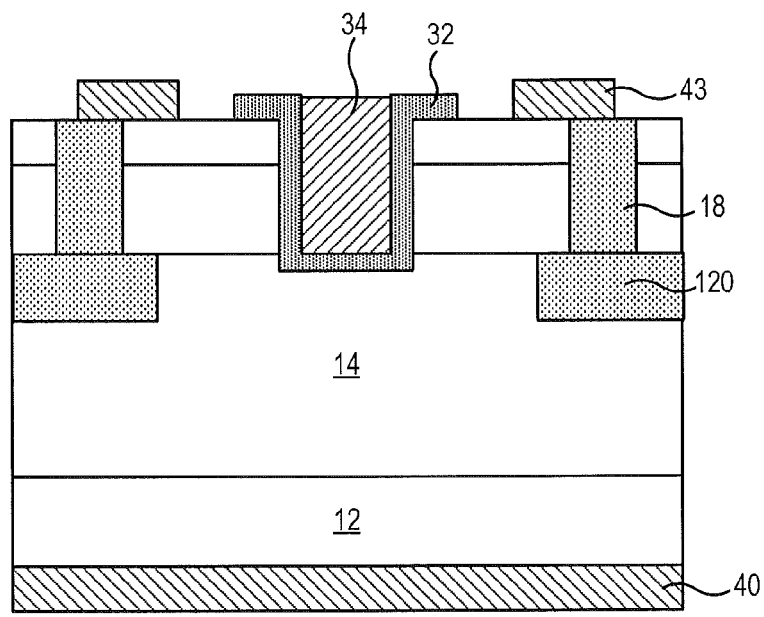

Referring to FIG. 5F, after formation of the gate insulator 32, a polysilicon gate 34 may be deposited in the trench 70 and doped, for example, with boron. Ni may be deposited and sintered to form the n-type source ohmic contact 43 and the drain ohmic contact 40.

Figure 6:
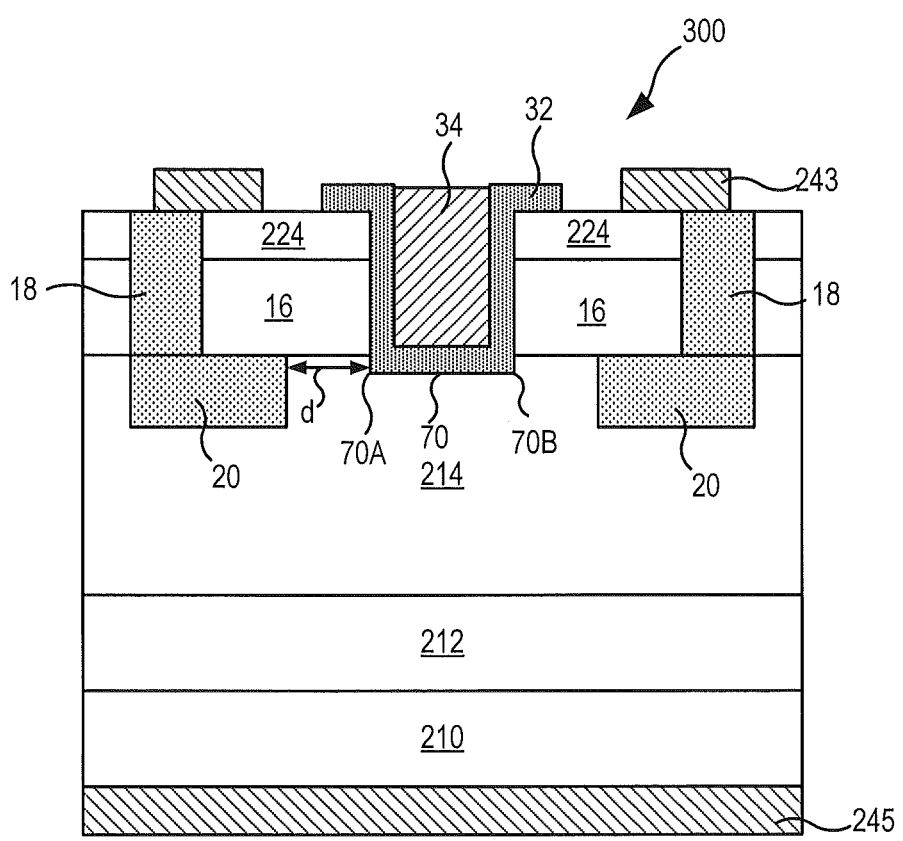
FIG. 6 is a cross sectional view of an insulated gate bipolar transistor according to some embodiments.

An insulated gate bipolar transistor (IGBT) device 300 according to some embodiments is illustrated in FIG. 6. As shown therein, the IGBT device includes an n− drift epitaxial layer 214 on a p-type epitaxial layer 212. The p-type epitaxial layer 212 is formed on a heavily doped p-type, 2° to 8° off-axis 4H—SiC substrate or layer 210. The n− drift layer 214 may have a thickness of about 80 μm to about 200 μm, and may be doped with n-type dopants at a doping concentration of about $5 \times 10^{13}$ cm$^{-3}$ to about $6 \times 10^{14}$ cm$^{-3}$ for a blocking capability exceeding 10 kV.

The device 300 includes collector ohmic contacts 243 on a collector region 224 and an emitter contact 245 on the substrate 210. The remainder of the structure is similar to the structure shown in FIG. 1.

Some embodiments of the present invention provide trench UMOS structures that include epitaxially regrown channel layers on the sidewalls of the trench, wherein the channel layers have the same conductivity type as the body layers. For example, an n-channel UMOS device according to some embodiments may include a p-type epitaxial channel layer on a sidewall of the UMOS trench. The epitaxially regrown channel layers may improve inversion channel mobility as well as maintain a high threshold voltage.

Conventional n-channel vertical-trench MOSFET structures typically include a p-type trench sidewall that is formed by a selective plasma dry etch. However, due to the damage caused to the trench sidewalls by the dry etch process, the crystal structure of the etched surface may be very poor, which can degrade the inversion channel mobility and lead to poor MOS channel conductivity.

A conventional approach to overcome this problem in an n-channel device is to form a thin, lightly doped n-type channel layer by epitaxial regrowth on a vertical sidewall of the trench. The n-type channel layer acts as an accumulation layer and provides a current path that connects the n-type source and drain regions of the device. As a result, forward conduction of the device may be greatly improved. However, providing an n-type channel layer on a p-type body region may lower the threshold voltage of the device, which affects the off-state blocking capability and reliability of the device, especially at high temperatures.

In contrast, some embodiments of the present invention provide an epitaxial channel layer on a sidewall of a UMOS trench that has the opposite conductivity type from the source/drain regions (i.e. for an n-channel device, the epitaxial channel layer is p-type). The gate insulator and gate are arranged so that both horizontal and vertical inversion layers are formed in the epitaxial channel layer upon application of a gate voltage, which provides a current path between the source and drain regions of the device during forward operation.

Figure 7:
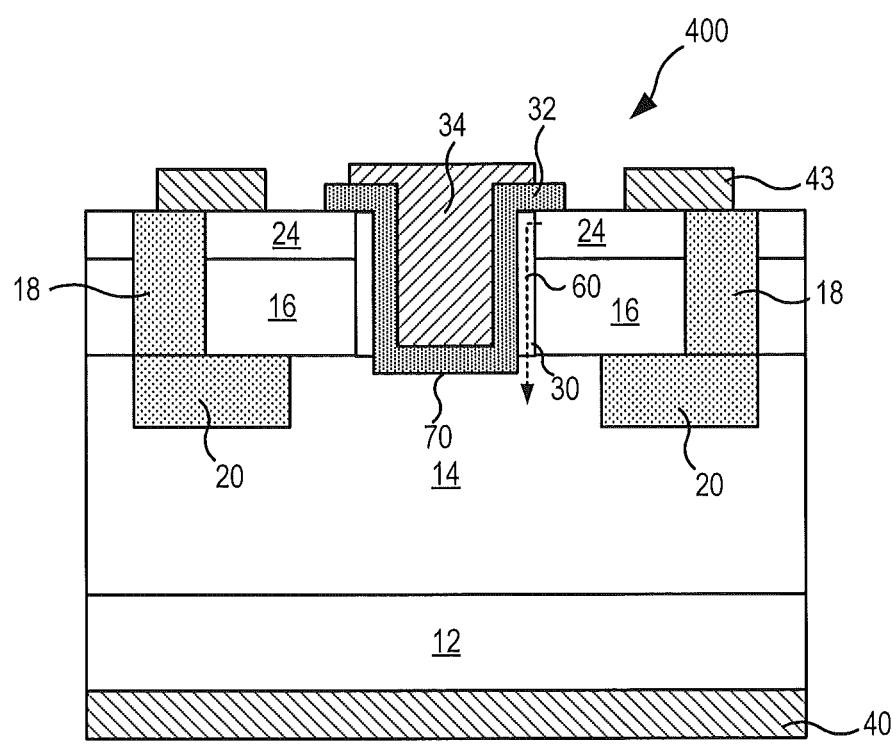
FIG. 7 is a cross sectional illustration of a cell of a power MOSFET according to further embodiments.

For example, a unit cell of a MOSFET structure 400 according to some further embodiments is shown in FIG. 7. As shown therein, the device 400 includes a channel layer 30 formed on a sidewall of the trench 70. The channel layer 30 may have the second conductivity type. That is, when the body region 16 is p-type, the channel layer 30 may also be p-type. The channel layer 30 may be formed by epitaxial regrowth, which may allow the channel layer 30 to have a high crystal quality and/or a tightly controlled doping level.

A gate insulator 32 is on sidewall surfaces and bottom surfaces of the trench 70. The gate insulator 32 may extend up over the channel layer 30 and onto the source region 24.

A gate electrode 34 is on the gate insulator 32. The gate electrode 34 may, for example, include doped polysilicon. The gate conductor 34 may also extend up over the channel layer 34 and onto the source region 24.

When a sufficient voltage is applied to the gate electrode 34, an inversion channel is formed at both a side surface and an upper surface of the channel layer 30, allowing charge carriers to flow from the source region 24 through the channel layer 30 and to the drift layer 14 along the path 60. Forming the channel layer to have the same conductivity type as the body region 16 may increase the threshold voltage by about 1 volt, which can significantly decrease leakage current in the device.

The channel layer 30 formed on the sidewall of the trench 30 may provide a SiC layer with a high crystal quality, which may improve the quality of the interface between the channel layer 30 and the gate insulator 32. This may improve the inversion channel mobility, and may also maintain the threshold voltage high enough for robust off-state performance as well as improving long term reliability and high temperature stability.

The channel layer 30 may be formed by epitaxially growing a semiconductor layer having the same conductivity type as the body region 16 on the source layer and on the sidewall and floor of the trench 70, then anisotropically etching the semiconductor layer to remove the semiconductor layer from the source layer and from the floor of the trench to thereby form the channel layer 30 on the sidewall of the trench adjacent the source layer and the body layer. Formation of an epitaxial channel layer 30 is described in more detail in U.S. application Ser. No. 13/798,919, entitled "FIELD EFFECT TRANSISTOR DEVICES WITH REGROWN LAYERS," filed concurrently herewith, the disclosure of which is incorporated herein by reference.

It will be appreciated that although some embodiments of the invention have been described in connection with silicon carbide IGBT and MOSFET devices having n-type drift layers, the present invention is not limited thereto, and may be embodied in devices having p-type substrates and/or drift layers. Furthermore, the invention may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a drift layer having a first conductivity type;
a first region in the drift layer, the first region having a second conductivity type that is opposite the first conductivity type;
a body layer having the second conductivity type on the drift layer including the first region;
a source layer on the body layer, the source layer having the first conductivity type;
a body contact region having the second conductivity type, the body contact region extending through the source layer and the body layer and into the first region;
a trench in the source layer and the body layer, the trench extending into the drift layer adjacent the first region, the trench having an inner sidewall facing away from the first region;
a gate insulator on the inner sidewall of the trench;
a gate contact on the gate insulator; and
a source ohmic contact on the source layer,
wherein the body contact region conductively connects the first region to the source ohmic contact.

2. The transistor device of claim 1, wherein a distance between the first region and a bottom corner of the trench is about 0.1 microns to about 2 microns.

3. The transistor device of claim 1, wherein the body layer and the source layer comprise epitaxial layers.

4. The transistor device of claim 1, wherein an upper portion of the drift layer adjacent the trench is doped with first conductivity type dopants more heavily than a lower portion of the drift layer to provide a current spreading region in the upper portion of the drift layer.

5. The transistor device of claim 4, wherein the first region is shallower than the current spreading region.

6. The transistor device of claim 5, wherein the current spreading region extends beneath the first region.

7. The transistor device of claim 1, further comprising an epitaxial channel layer on the inner sidewall of the trench, the epitaxial channel layer having the second conductivity type.

8. The transistor device of claim 1, wherein the first region extends away from the body contact region toward a bottom corner of the trench.

9. The transistor device of claim 1, wherein, the body contact region and the first region form a continuous region having the second conductivity type.

10. A transistor device, comprising:
a lower drift layer having a first conductivity type;
an upper drift layer having the first conductivity type, wherein the upper drift layer is more heavily doped than the lower drift layer;
a first region in the upper drift layer, the first region having a second conductivity type that is opposite the first conductivity type;
a body layer having the second conductivity type on the upper drift layer;
a source layer on the body layer, the source layer having the first conductivity type;

a body contact region having the second conductivity type, the body contact region extending through the source layer and the body layer and into the first region;

a trench in the source layer and the body layer, the trench extending into the drift layer adjacent the first region, the trench having an inner sidewall facing away from the first region;

a gate insulator on the inner sidewall of the trench;

a gate contact on the gate insulator; and a source ohmic contact on the source layer, wherein the body contact region conductively connects the first region to the source ohmic contact.

11. The transistor device of claim 10, wherein the first region extends away from the body contact region toward a bottom corner of the trench.

12. The transistor device of claim 10, wherein the body contact region and the first region form a continuous region having the second conductivity type.

13. A transistor device, comprising:

a drift layer having a first conductivity type;

a body layer on the drift layer, the body layer having a second conductivity type that is opposite the first conductivity type;

a source layer on the body layer, the source layer having the first conductivity type;

a trench in the source layer and the body layer, the trench having an inner sidewall and extending into the drift layer;

a gate insulator on the inner sidewall of the trench;

a gate contact on the gate insulator;

a body contact region having the second conductivity type and extending through the source layer and the body layer and into the drift layer;

a first region in the drift layer, the first region having the second conductivity type and contacting the body contact region, wherein the first region extends away from the body contact region toward a bottom corner of the trench; and a source ohmic contact on the source layer, wherein the body contact region conductively connects the first region to the source ohmic contact.

14. The transistor device of claim 13, wherein the body contact region and the first region form a continuous region having the second conductivity type.

* * * * *